United States Patent [19]

Suzuki

[11] Patent Number: 5,042,918
[45] Date of Patent: Aug. 27, 1991

[54] LIQUID CRYSTAL DISPLAY DEVICE

[75] Inventor: Kouji Suzuki, Yokohama, Japan

[73] Assignee: Kabushiki Kaisha Toshiba, Kawasaki, Japan

[21] Appl. No.: 423,206

[22] Filed: Oct. 18, 1989

[30] Foreign Application Priority Data

Nov. 15, 1988 [JP] Japan ............... 63-286771

[51] Int. Cl.⁵ ............................................. G02F 1/13
[52] U.S. Cl. ......................................... 359/59; 359/87; 357/23.7
[58] Field of Search ................. 357/23.7, 23.6; 350/333, 334, 336

[56] References Cited

U.S. PATENT DOCUMENTS

| | | | |
|---|---|---|---|
| 3,862,360 | 1/1975 | Dill et al. | 350/334 |
| 4,103,297 | 7/1978 | McGreivy et al. | 350/334 |
| 4,621,260 | 11/1986 | Suzuki et al. | 340/719 |
| 4,700,458 | 10/1987 | Suzuki et al. | 437/83 |
| 4,715,685 | 12/1987 | Yaniv et al. | 350/332 |
| 4,759,610 | 7/1988 | Yanagisawa | 357/23.7 |
| 4,772,099 | 9/1988 | Kato et al. | 350/336 X |
| 4,821,092 | 4/1989 | Noguchi | 350/336 X |
| 4,839,707 | 6/1989 | Shields | 350/336 |

FOREIGN PATENT DOCUMENTS

| | | |
|---|---|---|
| 0279171 | 8/1988 | European Pat. Off. . |
| 59-119329 | 7/1984 | Japan . |
| 62-100734 | 3/1987 | Japan ............... 350/336 |
| 62-109025 | 5/1987 | Japan . |
| 63-85687 | 4/1988 | Japan . |
| 2120827 | 12/1983 | United Kingdom . |

OTHER PUBLICATIONS

SID '89 Digest, pp. 148–150 (May, 1989); K. R. Sarma et al, "Active-Matrix LCDs Using Gray-Scale in Half-tone Methods".
SID '83 Technical Digest, K. Suzuki et al; May 1983; "High-Resolution Transparent-Type a-Si TFT LCD's".
SID '83 Technical Digest "A Liquid Crystal Display Panel Using a Te-TFT Array" p. 148; M. Matsuura et al; May 1983.
SID '81 Technical Digest, Toshio Yanagisawa et al, pp. 110–111 "An MOS Array with Platinum Display Electrodes for Reflective Dynamic etc.".

*Primary Examiner*—Andrew J. James
*Assistant Examiner*—Sara W. Crane
*Attorney, Agent, or Firm*—Oblon, Spivak, McClelland, Maier & Neustadt

[57] ABSTRACT

A liquid crystal display device includes a matrix array substrate, an upper substrate, and a liquid crystal layer sealed between the substrates. The matrix array substrate has a plurality of first display electrodes connected to thin film transistors which are arranged on a substrate, and an insulation film covering the first display electrodes and the thin film transistors. A plurality of second display electrodes are arranged on the insulation film and face the corresponding first display electrodes to form a capacity connection therewith. The second display electrodes are applied with potentials by the first display electrodes. A transmission factor of the liquid crystal layer is variable in accordance with a potential applied between the second display electrodes and a transparent conductive film of the upper substrate.

9 Claims, 4 Drawing Sheets

LIQUID CRYSTAL DISPLAY DEVICE

BACKGROUND OF THE INVENTION

1. Field of the Invention

The present invention relates to a liquid crystal display device.

2. Description of the Related Art

In recent years, liquid crystal display devices are attracting the attention of those skilled in the art since they are thin and light in weight, and are expected to replace conventional CRT display devices.

As an example of a transmission type liquid crystal display device, an active matrix address type liquid crystal which includes a thin film transistor (TFT) formed of amorphous silicon is known. Generally, this type of liquid crystal display device is made up of a transistor matrix array substrate, a filter substrate, and a liquid crystal layer sealed between the two substrates. The array substrate is obtained by arranging the following elements on a glass substrate: a gate electrode, a gate insulation film, an amorphous silicon layer serving as a thin film transistor, a source electrode, a drain electrode, a transparent display electrode plate, a protecting insulation film, etc. Likewise, the filter substrate is obtained by arranging the following elements on a glass substrate: a light-shielding layer, a color filter layer, and a transparent conductive film An orientation layer for orientating liquid crystal molecules in a predetermined direction is provided between the array substrate and the liquid crystal layer. It is also provided between filter substrate and the liquid crystal layer.

In the liquid crystal display device of the above structure, light is emitted toward the liquid crystal layer from a light source located behind the array substrate, and the light which has passed through the liquid crystal layer is directed from the surface of the filter substrate to external regions, so as to display information on the liquid crystal display device.

The amount of light passing through the liquid crystal layer varies in accordance with the condition in which the liquid crystal molecules of the liquid crystal layer facing the transparent display electrode plate are arranged. The condition in which the liquid crystal molecules are arranged is controlled by a voltage or a display potential applied between the electrode plate and the transparent conductive film. To show desirable information or an image on the liquid crystal display device, each picture element of the liquid crystal display device is applied with a predetermined display potential by the TFT.

In the liquid crystal layer, the regions whose liquid crystal transmission factor are controllable are limited to those regions which face the transparent display electrode plate. In other words, the regions which do not face the transparent display electrode plate cannot be controlled or modified with respect to the liquid crystal transmission factor (such regions will hereinafter be referred to as unmodulated regions). To improve the contrast exhibited by the liquid crystal display device, a light-shielding layer is normally formed on those portions of the filter substrate which face the unmodulated regions of the liquid crystal layer, thereby shielding light which may leak from the unmodulated regions. Therefore, the ratio of the area, which can be actually used for showing information, to the entire display area of the display device (in short, the aperture ratio of the display device) is determined by the area on which the light-shielding layer is not formed. Generally, for considering misregistration between the array and filter substrates when they are jointed to each other, this type of display device employs a light-shielding layer wider than the area of the unmodulated regions, and part of the light-shielding layer overlaps the peripheral portions of the display electrode plate.

The performance of the display device may be improved if a large aperture ratio is provided. For this purpose, it is necessary to increase the area of the transparent display electrode plate. However, if the electrode plate is large in area, the space between the electrode plate and the signal lines of the array substrate is inevitably narrow. It is therefore likely that the electrode plate and the signal lines will be short-circuited to each other, either directly or through dust which may enter the space. Accordingly, the display device may have a number of point defects, resulting in the degradation of the manufacturing yield of the display device.

As may be understood from the above, the satisfactory display performance of the display device and the manufacturing yield thereof are incompatible with each other. It is for this reason that a conventional display device cannot employ a display electrode plate having a large area.

SUMMARY OF THE INVENTION

The present invention is contrived in consideration of the above circumstances, and its object is to provide a liquid crystal display device wherein the area of the display electrode can be increased without degrading the manufacturing yield.

To achieve this object, the present invention has provided a liquid crystal display device wherein the matrix array substrate comprises an insulation film which covers a plurality of thin film transistors, signal lines, address lines, and first transparent display electrodes, these elements being provided on a substrate; and a plurality of second transparent display electrodes arranged on the insulation film so as to face their corresponding first display electrodes. The first display electrodes serve to store charges, while the second display electrodes serve to drive the liquid crystal, i.e., to apply a voltage to the liquid crystal.

In the above liquid crystal display device, the insulation film reliably insulates the second display electrodes from their surrounding signal lines and address line gates. With this structure, even if the second display electrodes are enlarged to be located above the address lines, they are never short-circuited to the address lines. Therefore, the second display electrodes can be made large enough to provide improved display performance.

It should be also noted that the liquid crystal is driven by the second display electrodes. Therefore, the effective display area of the display device is not adversely affected even if the first display electrodes are reduced in size so as to provide a wide space between the first display electrodes and their neighboring signal and address lines. In addition, the first display electrodes and their neighboring signal and address lines are prevented from short-circuiting to each other, due to the provision of the above-mentioned wide space. Accordingly, the number of probable point defects can be reduced and high manufacturing yield can be expected.

BRIEF DESCRIPTION OF THE DRAWINGS

FIGS. 1 to 3 illustrate a liquid crystal display device according to a first embodiment of the present invention; wherein FIG. 1 is a schematic circuit diagram of the device, FIG. 2 is a plan view showing part of the device, and FIG. 3 is a sectional view taken along line III—III in FIG. 2;

FIGS. 4 to 7 illustrate a liquid crystal display device according to a second embodiment of the present invention; wherein FIG. 4 is a plan view showing part of the device, FIG. 5 is a sectional view taken along line V—V in FIG. 4, and FIGS. 6 and 7 are sectional views showing the process in which the second display electrodes of the device are formed; and FIGS. 8 and 9 illustrate liquid crystal display device according to a third embodiment of the present invention, wherein FIG. 8 is a plan view showing part of the device, and FIG. 9 is a sectional view taken along line IX—IX in FIG. 8.

DETAILED DESCRIPTION OF THE PREFERRED EMBODIMENTS

Preferred embodiments of the invention will now be described in detail with reference to the accompanying drawings.

Figure 2:
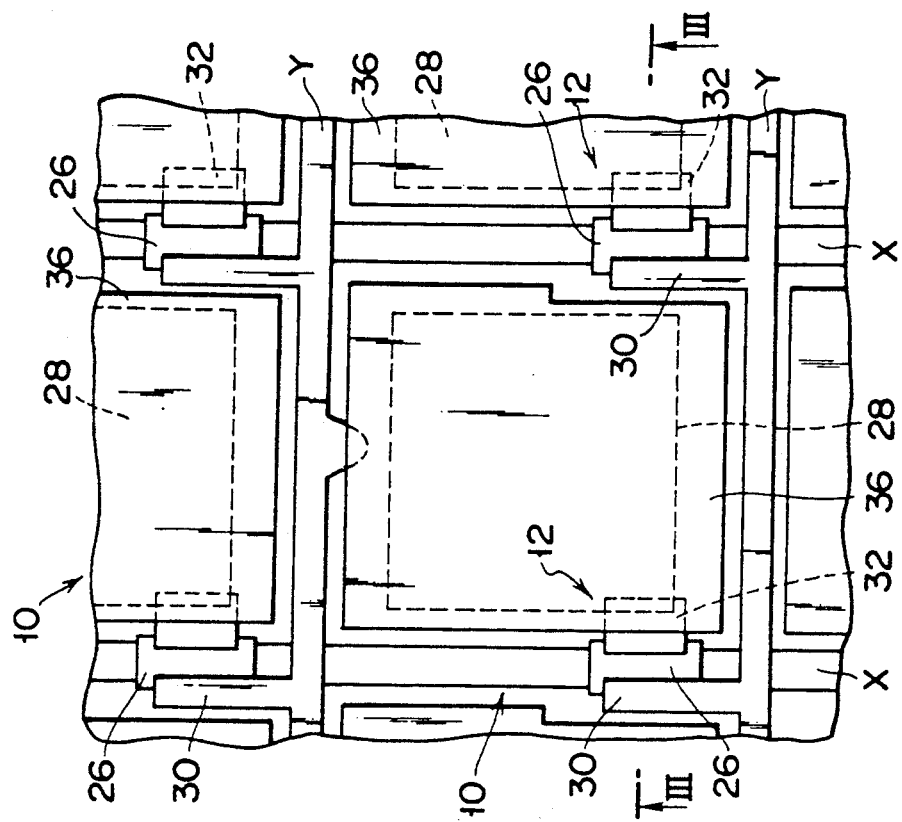
Figure 1:
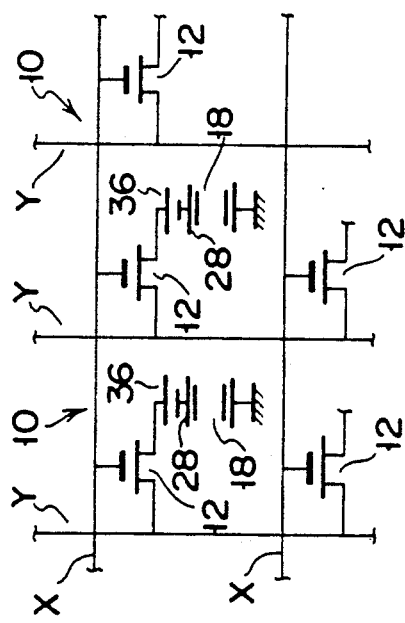
Figure 3:
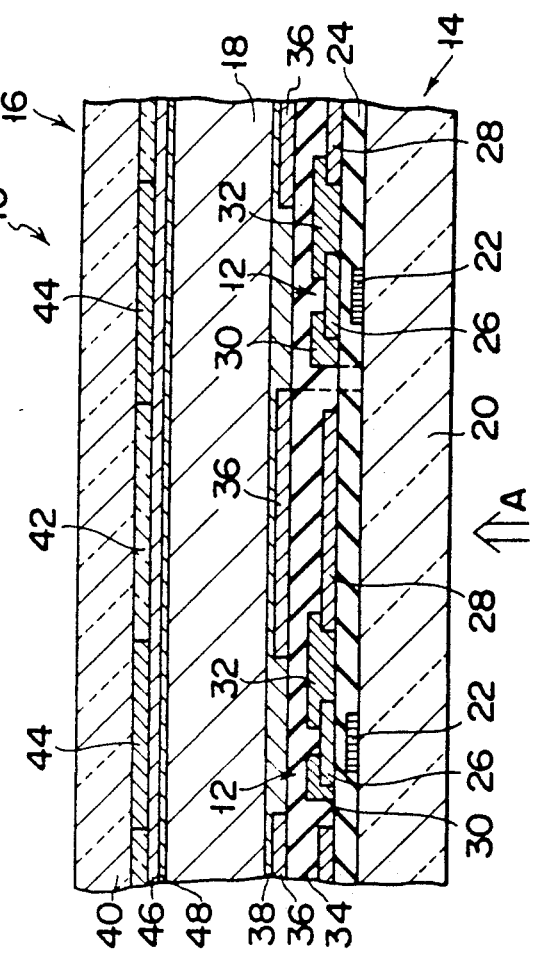

FIGS. 1-3 illustrate a liquid crystal display device according to a first embodiment of the present invention.

Referring to FIG. 1, the liquid crystal display device is of an active matrix type comprising a plurality of picture element units 10 arranged in a matrix pattern. These units are driven by picture element circuits, and each of the pixel circuits includes thin film transistor (TFT) 12. Each TFT 12 is connected to both address line X and signal line Y, which extend at right angles to each other.

More specifically, each unit 10 comprises matrix array substrate 14, filter substrate 16, and liquid crystal layer 18 sandwiched between these two substrates, as is shown in FIGS. 1 to 3. Array substrate 14 has glass substrate 20, on which gate electrode 22 of TFT 12 is located. Gate electrode 22 is of a laminated structure made up of a molybdenum-tantalum alloy film (i.e., a first layer) and a tantalum film (i.e., a second layer), and is formed to be integral with address line X. Gate electrode 22 and the upper surface of glass substrate 20 are covered with gate insulation layer 24. On this gate insulation layer, amorphous silicon layer 26 of TFT 12 is formed in a manner to face gate electrode 22. On the gate insulation layer, first transparent display electrode layer 28 is also formed in the region surrounded by address and signal lines X and Y. TFT 12 has source electrode 30 which is in contact with silicon layer 26. This source electrode is formed on gate insulation layer 24 and is integral with signal line Y. TFT 12 also has drain electrode 32 formed on gate insulation layer 24. This drain electrode connects silicon layer 26 and first display electrode layer 28 together, and is of a laminated structure made up of a first layer formed of molybdenum and a second layer of aluminum. The above-mentioned transistor matrix array and first display electrode layer 28 are covered with silicon nitride insulation layer 34 formed by use of the plasma CVD process.

Second transparent display electrode layer 36 is formed on insulation layer 34 to face first display electrode layer 28. First and second electrode layers 28 and 36 are ITO layers having a thickness of 700 Å. Second electrode layer 36 is substantially rectangular and has a surface area wider than that of first electrode layer 28. Second electrode layer 36 is formed in such a manner that its outline falls within the region defined between first electrode layer 28 and address and signal lines X and Y. Both insulation layer 34 and second electrode layer 36 are covered with orientation layer 38 by which the liquid crystal molecules of liquid crystal layer 18 are orientated.

Filter substrate 16 has glass plate 40, on one surface of which are formed transparent filter layer 42 facing second display electrode layer 36, and light-shielding layer 44 facing TFT 12, address line X, and signal line Y. Transparent conductive layer 46 and orientation layer 48 are formed in the mentioned order on filter layer 42 and also on light-shielding layer 44.

Liquid crystal layer 18 is sealed between orientation layer 38 of array substrate 14 and orientation layer 48 of filter substrate 16.

In the liquid crystal display device having the above structure, first transparent display electrode layers 28 serve as an electrode for storing charges, while second transparent display electrode layers 36 serve as a display electrode for controlling the orientation of the liquid crystal molecules of liquid crystal layer 18. To be specific, when a predetermined potential is applied between first electrode layer 28 and transparent conductive film 46 of filter substrate 16, part of the potential stored between layer 28 and film 46, i.e., the partial voltage corresponding to the electric capacity at the location of second electrode layer 36, is applied to second electrode layer 36. As a result, the transmission factor of that region of liquid crystal layer 18 which faces second electrode layer 36 is modulated. As may be understood from this, it is preferable that the electric capacity obtained from first and second electrode layers 28 and 36 is larger than the electric capacity obtained from second electrode layer 36 and transparent conductive film 46, so as to improve the driving efficiency of the liquid crystal layer. In the first embodiment, therefore, the thickness of insulation layer 34 is determined to be 5,000 Å, the thickness of the liquid crystal layer is determined to be 60,000 Å, and the capacity ratio between insulation layer 34 and the liquid crystal layer is determined to be about 10:1.

When light A is emitted from a light source (not shown) located behind array substrate 14 toward array substrate 14, with the transmission factor of the liquid crystal layer modified, light A passes through glass substrate 20, insulation layer 24, first electrode layers 28, insulation layer 34, second electrode layers 36, orientation layer 38, liquid crystal layer 18, orientation layer 48, transparent conductive film 46, filter layers 42, and glass substrate 40, thereby displaying an image on the display region of the device.

In the above liquid crystal display device, each second display electrode layer 36, which serves as a virtual display electrode, is located sufficiently away from the electrodes of thin film transistor 12, the address line, and the signal line. In addition, since second display electrode layer 36 is formed on insulation layer 34, it is insulated from the electrodes of thin film transistor 12, the address line, and the signal line. With this structure, each second display electrode layer 36 can have a sufficiently wide surface area, without causing the problem that second display electrode layer 36 may be short-circuited to the electrodes of transistor 12, or to the address and signal lines. Therefore, the aperture ratio of the display device can be increased. Further, the size of the surface area of first display electrode layer 28 does not adversely affect the aperture ratio of the display device. Therefore, the size of first display electrode layer 2B can be decreased, so as to provide a sufficiently wide space between layer 28 and its neighboring elements namely, the electrodes of transistor 12, the address line, and the signal line. This structure is effective in reliably preventing occurrence of short circuit between the electrodes.

As is clear from the above, the liquid crystal device of the first embodiment has an aperture ratio which is increased without producing any probable point defect.

Figure 4:
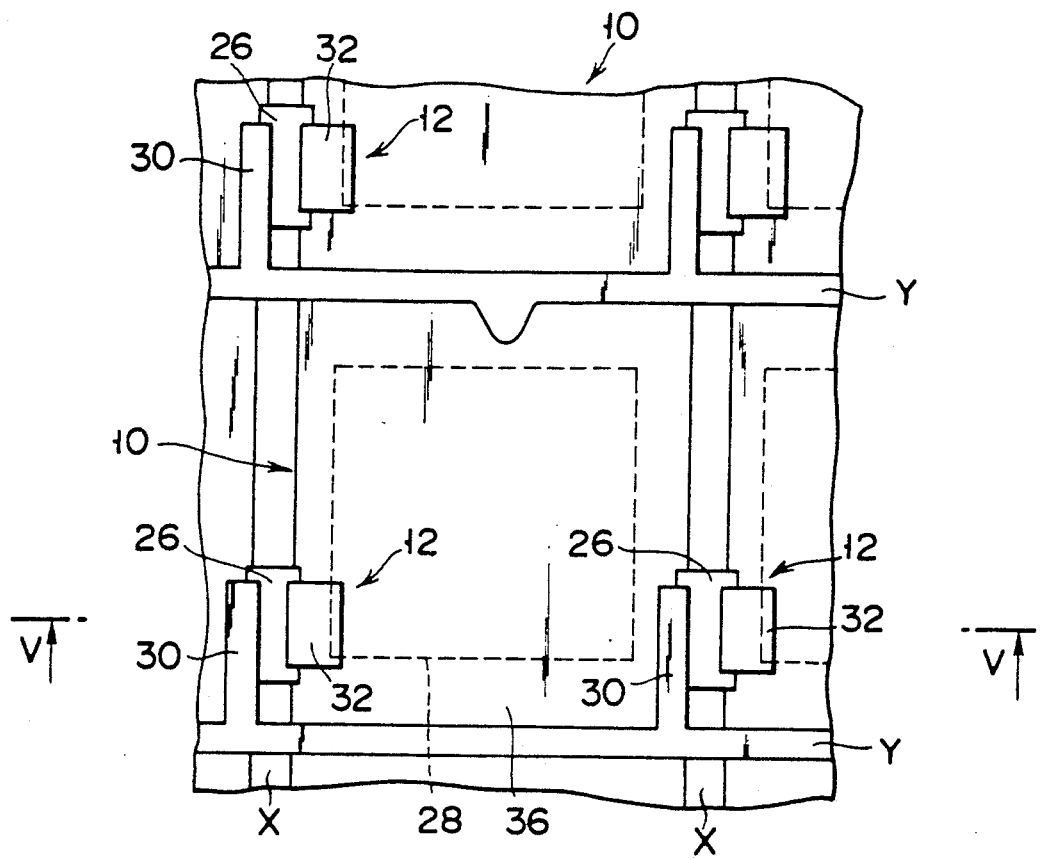
Figure 5:
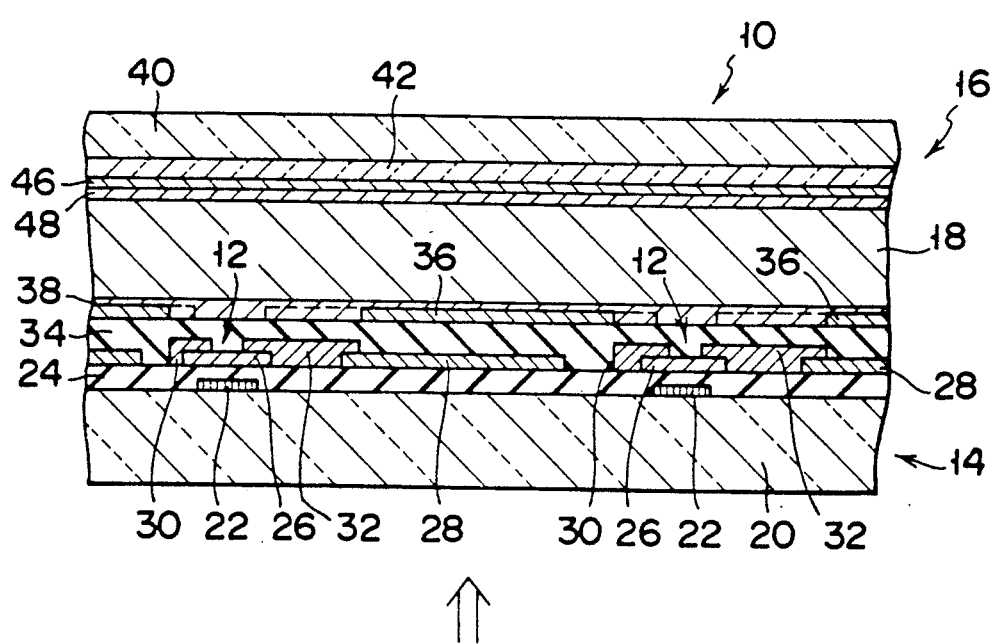

FIGS. 4 and 5 illustrate a liquid crystal display device according to a second embodiment of the present invention. Since the basic structure of the device of the second embodiment is substantially similar to that of the first embodiment, similar or corresponding structural elements will be indicated by the sam reference numerals, and explanation of them will be omitted.

In the second embodiment, each address line X is of a laminated structure made up of a 1,000 Å- thick molybdenum-tantalum alloy film as a first layer and a 1,500 Å- thick tantalum film as a second layer. Each signal line Y is also of a laminated structure made up of a 500 Å- thick molybdenum film as a first layer and a 4,000 Å- thick aluminum film as a second layer. Each second transparent display electrode layer 36 is formed, in a self-alignment fashion, within the region surrounded by address lines X and signal lines Y. In other words, second display electrode layer 36 is has the same shape and same size as the above-mentioned surrounded region.

The device of the second embodiment produces substantially similar advantages to those of the first embodiment. In addition, light A emitted from behind array substrate 14 passes through every portion of the liquid crystal layer that can be modified by second transparent electrode layers 36. Therefore, the maximum possible aperture ratio is available in the case of the second embodiment. Further, since light A passes through only the display region as a matter of fact, filter substrate 16 of the second embodiment does not have to comprise a light-shielding film.

Figure 6:
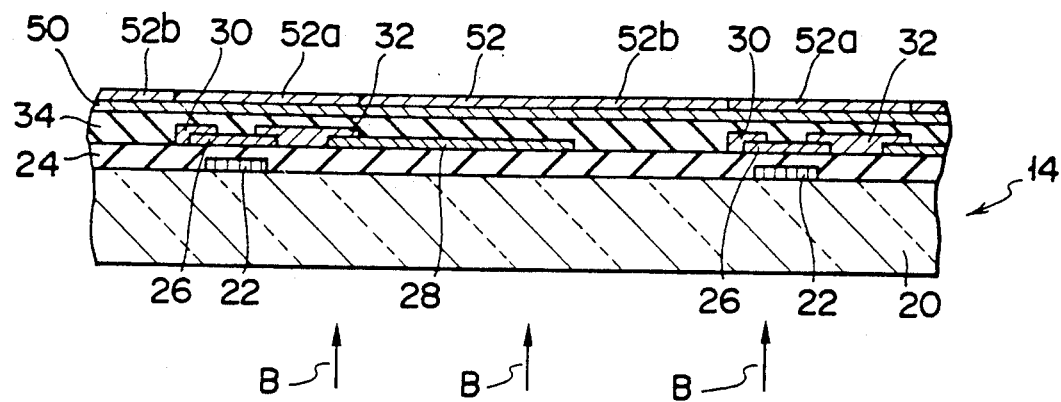
Figure 7:
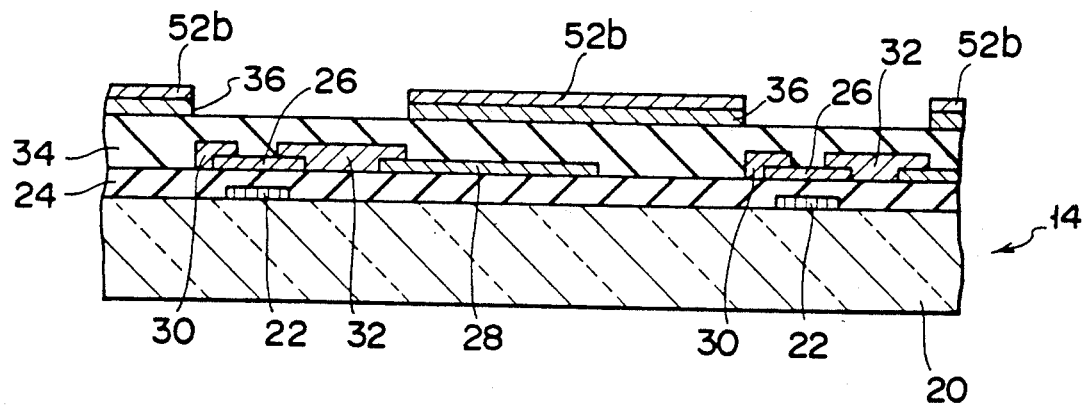

Second transparent display electrode layer 36 employed in the second embodiment is fabricated as follows:

As is shown in FIG. 6, a 700 Å- thick film of transparent electrode 50 (ITO) is first formed on insulation layer 34 which covers first transparent display electrode layer 28s, and then negative type resist layer 52 is coated on electrode 50. Thereafter, array substrate 14 is irradiated with ultraviolet light B emitted from behind glass substrate 20. After passing through glass substrate 20, ultraviolet light B is shielded in part by thin film transistors 12, address lines X and signal lines Y; the remainder of ultraviolet light B passes through first display electrode layers 28, insulation layer 34, and transparent electrode 50, so that resist layer 52 is selectively exposed to ultraviolet light B. As a result, resist layer 52 has non-irradiated portion 52a, which has a pattern corresponding to the shapes of thin film transistors 12, address lines X, and signal lines Y, and irradiated portions 52b. After this, resist layer 52 is developed and selectively etched out, thereby forming transparent display electrode layers 36 self-aligned with the region surrounded by lines X and Y, as is shown in FIG. 7.

The self-aligned layers or pattern need not be always formed in the above-mentioned fashion. They may be formed in a lift-off method, using a positive type resist layer and a transparent electrode.

Figure 8:
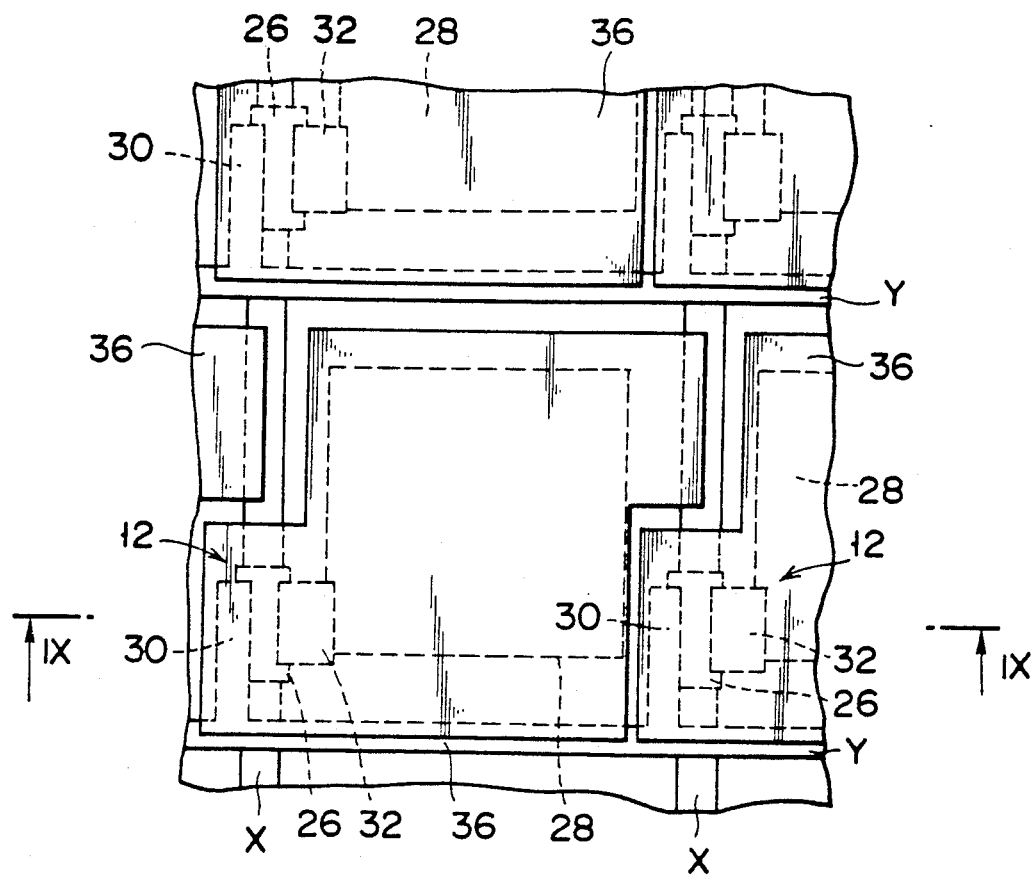
Figure 9:
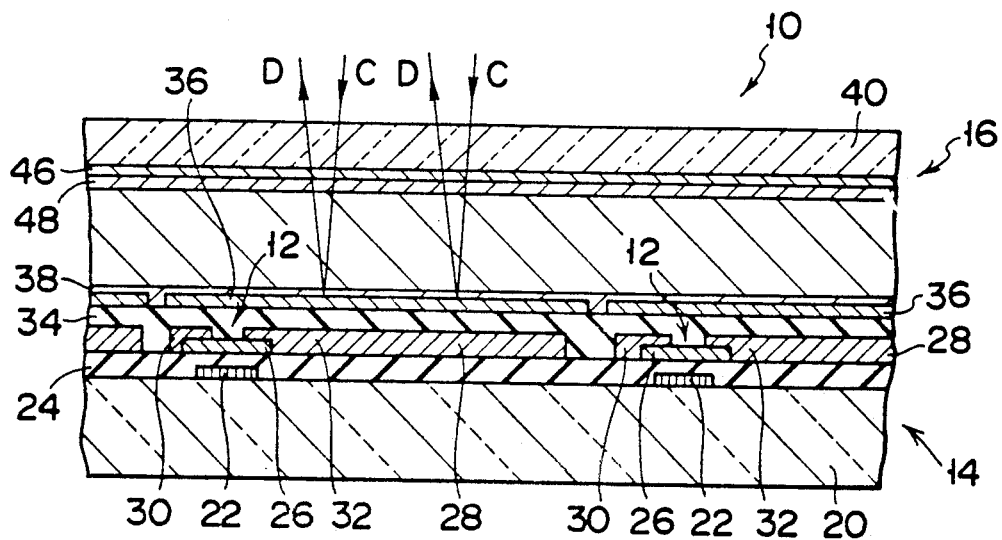

The first and second embodiments were described, referring to a transmission type liquid crystal display device wherein an image is displayed by use of light emitted from a light source. However, the present invention is not limited to this type of display device. It can be applied to a reflection type liquid crystal display device, as is seen from a third embodiment shown in FIGS. 8 and 9.

Since the basic structure of the third embodiment is substantially similar to that of the first embodiment, similar or corresponding structural elements will be indicated by the same reference numerals, and explanation of them will be omitted.

In the third embodiment, each of first display electrodes 28 of array substrate 14 is formed of Cr to to be integral with drain electrode 32 of TFT 12. On insulation layer 34 with which TFT 12 and display electrodes 28 are covered, second reflection type display electrode layers 36 formed of aluminum and having a thickness of 2,000 Å are provided, in place of the transparent display electrode layers employed in the foregoing embodiments. Each display electrode layer 36 is formed to cover the substantially entire region surrounded by address lines X and signal lines Y, the region located above TFT 12, and part of lines X and Y. It is preferable that second display electrode 36 be formed in a manner to minimize the parasitic capacity between itself and address lines X. Transparent conductive film 46 and orientation film 48 are formed on glass substrate 40 of substrate 16 in the order mentioned.

In the display device of the above structure, light C, which is incident on glass substrate 40 of substrate 16, passes through transparent conductive film 46, orientation film 48, liquid crystal layer 18 and orientation layer 38, and is then reflected by second reflection type display electrode layers 36. Reflected light D passes through orientation film 38 and substrate 16, thereby showing an image in accordance with the voltage applied to first display electrode layers 28.

The liquid crystal display device of the third embodiment is designed such that it can be used also as a projection type display device. In this type of display device, the rays of incident light C should be substantially parallel to one another; likewise, the rays of reflected light D should be substantially parallel to one another. Therefore, the surfaces of second reflection type display electrode layers 36 should preferably be as specular as possible.

In the liquid crystal display device of the above structure, each display electrode layer 36 can be expanded up to the region located above lines X and Y and up to the region located above TFT 12, so that the the display region of the device can be further widened. In the case where display electrode layer 36 is formed in the region located above TFT 12, incident light C does not directly enter TFT 12. As a result, the OFF-state current which may flow through TFT 12 due to external light is prevented from increasing.

In addition, it is not necessary to form through-holes in insulation layer 34, for electrically connecting first display electrode layer 28 to reflection type display electrode layer 36. Since the incident light is not irregularly reflected by such through-holes, high reflection efficiency is maintained. This advantage is effective particularly in the case of a display device for projection, wherein a large number of picture elements are arranged concentratedly within a narrow display region.

Moreover, in the third embodiment, insulation layer 34 separates second display electrode layers 36 from first display electrode layers 28. With this construction, line defects are hard to occur even if signal line Y is short-circuited to first electrode layer 28 and if second display electrode 36 is short-circuited to transparent conductive film 46, etc. Further, as the first embodiment, a sufficiently wide space can be provided between first display electrode layer 28 and signal lines Y, to prevent occurrence of point defects, and second display electrode 36 can be expanded for higher display performance.

What is claimed is:

1. A liquid crystal display device comprising:
    a matrix array substrate including: a substrate; a plurality of thin film transistors arranged on the substrate; signal lines and address lines which are connected to the thin film transistors; a plurality of first display electrodes arranged on the substrate and connected to corresponding ones of the thin film transistors so as to store potentials applied by the thin film transistors; an insulation film covering the thin film transistors, the signal lines, the address lines, and the first display electrodes; and a plurality of second display electrodes arranged on the insulation film and facing corresponding ones of the first display electrodes to form a capacity connection with the first display electrodes so that the second display electrodes are applied with potentials by the first display electrodes, each of which said second display electrodes having a surface area wider than that of the corresponding first display electrode, and being formed to cover the substantially whole surface area of the corresponding first display electrode;
    an upper substrate including a transparent conductive film facing the second display electrodes; and
    a liquid crystal layer sandwiched between the matrix array substrate and the upper substrate, said liquid crystal layer having a transmission factor which is variable in accordance with a potential applied between the second display electrodes and the transparent conductive film.

2. A device according to claim 1, wherein said address lines and said signal lines cross each other, and each of the first display electrodes and the corresponding second display electrode are located in a region surrounded by the address and signal lines.

3. A device according to claim 2, wherein each of said second display electrodes has a shape and a size substantially similar to those of the region surrounded by the address and signal lines.

4. A device according to claim 2, wherein said first and second electrodes are transparent.

5. A device according to claim 4, wherein said upper substrate includes light-shielding films located to face the address lines, the signal lines, and the thin film transistors.

6. A device according to claim 1, wherein each of said second display electrodes is a reflection type electrode which reflects light incident thereon through the liquid crystal layer to an external region of the device through the liquid crystal layer.

7. A device according to claim 6, wherein said address lines and said signal lines cross each other, and each of the first display electrodes is located in a region surrounded by the address and signal lines.

8. A device according to claim 7, wherein each of said second display electrodes is formed to cover the surrounded region substantially entirely and the corresponding thin film transistor.

9. A liquid crystal display device comprising:
    a matrix array substrate including: a substrate; a plurality of thin film transistors arranged on the substrate; signal lines and address lines which are connected to the thin film transistors; a plurality of first transparent display electrodes arranged on the substrate and connected to corresponding ones of the thin film transistors so as to store potentials applied by the thin film transistors; an insulation film covering the thin film transistors, the signal lines, the address lines, and the first transparent display electrodes; and a plurality of second transparent display electrodes arranged on the insulation film and facing corresponding ones of the first transparent display electrodes to form a capacity connection with the first display electrodes so that the second display electrodes are applied with potentials by the first display electrodes, each of said second transparent display electrodes having a surface area wider than that of the corresponding first transparent display electrode, and being formed to cover the substantially whole surface area of the corresponding first transparent display electrode;
    an upper substrate including a transparent conductive film facing the second transparent display electrodes; and
    a liquid crystal layer sandwiched between the matrix array substrate and the upper substrate, said liquid crystal layer having a transmission factor which is variable in accordance with a potential applied between the second display electrodes and the transparent conductive film.

* * * * *